United States Patent [19] [11] 3,803,458
Morena, Jr. [45] Apr. 9, 1974

[54] PACKAGE FOR A MICROELECTRONIC DEVICE

[76] Inventor: Alfred Morena, Jr., 277 Corbett, North Plainfield, N.J. 07060

[22] Filed: July 9, 1971

[21] Appl. No.: 161,125

[52] U.S. Cl. ....... 317/234 R, 317/234 G, 317/234 N
[51] Int. Cl. .............................................. H01l 5/00
[58] Field of Search ....................................... 317/234

[56] References Cited

UNITED STATES PATENTS 3,548,494 12/1970 Haring ................................ 29/626
3,624,462 11/1971 Phy .................................... 317/234
3,641,398 2/1972 Fitzgerald ........................... 317/234
3,520,054 7/1970 Pensack ................................ 29/627
3,617,817 11/1971 Kawakatsu ........................... 317/234
3,483,308 12/1969 Wakely ................................ 174/52

*Primary Examiner*—Rudolph V. Rolinec
*Assistant Examiner*—E. Wojciechowicz
*Attorney, Agent, or Firm*—David S. Woronoff

[57] ABSTRACT

A monolithic ceramic package of the type useful for semiconductor encapsulation is fabricated in two subassemblies. A low cost one of the subassemblies is adapted to receive a semiconductor device for testing. Only after the device is tested and determined to be operative is the remainder of the package secured to the test portion.

9 Claims, 5 Drawing Figures

PACKAGE FOR A MICROELECTRONIC DEVICE

FIELD OF THE INVENTION

This invention relates to encapsulation of electronic devices such as insulating or ceramic packages for semiconductor devices.

BACKGROUND OF THE INVENTION

Semiconductor devices are typically too small and delicate to be handled in normal environmental conditions. Consequently, such devices are normally encapsulated in a ceramic package which provides a mechanically manageable geometry and hermetically seals the encapsulated device from the environment.

A typical encapsulation comprises a monolithic sandwich of first, second and third ceramic layers. The top first and second layers have central apertures exposing the third layer. The exposed portion of the third layer includes a metallized pad to which a semiconductor is connected. The second layer includes a sunburst pattern of conductors originating at the central aperture and exposed at the periphery of the layer for external contact. The first layer includes a metallic annulus surrounding the aperture to which a cap is secured to provide a hermetic seal.

A semiconductor device is secured to the pad on the third layer and minute leads are connected between discrete areas of the semiconductor and selected proximate ends of the sunburst conductor pattern. Electrical connections to the outside world are made typically through a rigid comb-like conductor structure, the teeth of which are connected to the exposed remote ends of the sunburst. After the teeth and the cap are secured, the teeth are separated from their support and become electrically isolated one from the other. Such electrical isolation is not only necessary for practical use of the encapsulated device; it is necessary to test the device after the cap is secured.

Many of the devices tested at this stage unfortunately are defective either through defective fabrication of the semiconductor devices or through a failure in the connection thereof to the sunburst pattern. Or, perhaps, even a failure in the package itself. The failure rate for one reason or another is sufficiently high — 60 percent — to constitute a major problem in the industry adding appreciably to the average cost of salable items.

The problem is particularly annoying because, in many instances, the ceramic package is more expensive than the encapsulated device and is salvaged only at a high cost. Typically, rejects are discarded, encapsulation and all.

BRIEF DESCRIPTION OF THE INVENTION

This invention capitalizes on the recognition that a semiconductor device can be tested when it is secured to a contact pad and connected by tiny leads to metallic contact areas which are electrically isolated. A single ceramic test layer with a centrally located contact pad for receiving a device along with a relatively small sunburst pattern to proximate ends of which minute lead connections are bonded permits the test function to be performed.

Only after testing is the remainder of the package secured to the test layer in a manner to insure a hermetically sealed usable device in almost every instance. In those cases where a defective arrangement is found, the cost for discarding is relatively low because of the low cost of the simple test layer and the absence of a rigid comb-like contact structure. Moreover, the component is easily recovered by reflowing the lead connections.

In one specific embodiment of this invention, a package is completed by making a ceramic test layer with a contact ring of metallic material which totally encompasses a first minute sunburst pattern thereon. A second ceramic layer bearing a central aperture is soldered to the contact ring when testing is complete and the subassemblies are to be joined. The central aperture is sufficiently large to expose the proximate ends of the sunburst pattern of the test portion but covers the remote ends of the pattern. The second layer includes a second relatively large metallic sunburst pattern on its top surface and metallized or metal filled holes extending from the proximate ends of the sunburst through the layer to the bottom surface thereof for contacting the remote ends of the first sunburst pattern. The second layer is formed from the green ceramic in a monolithic arrangement with a third ceramic layer which covers the top surface thereof and exposes the remote ends of the second sunburst for external connection.

In another embodiment, the test portion of the package is made of a rounded rectangular shape and the monolithic mating structure is fabricated with an additional layer with a matching central aperture. The test portion is self positioning when inserted into the mating aperture.

DETAILED DESCRIPTION

Figure 1:
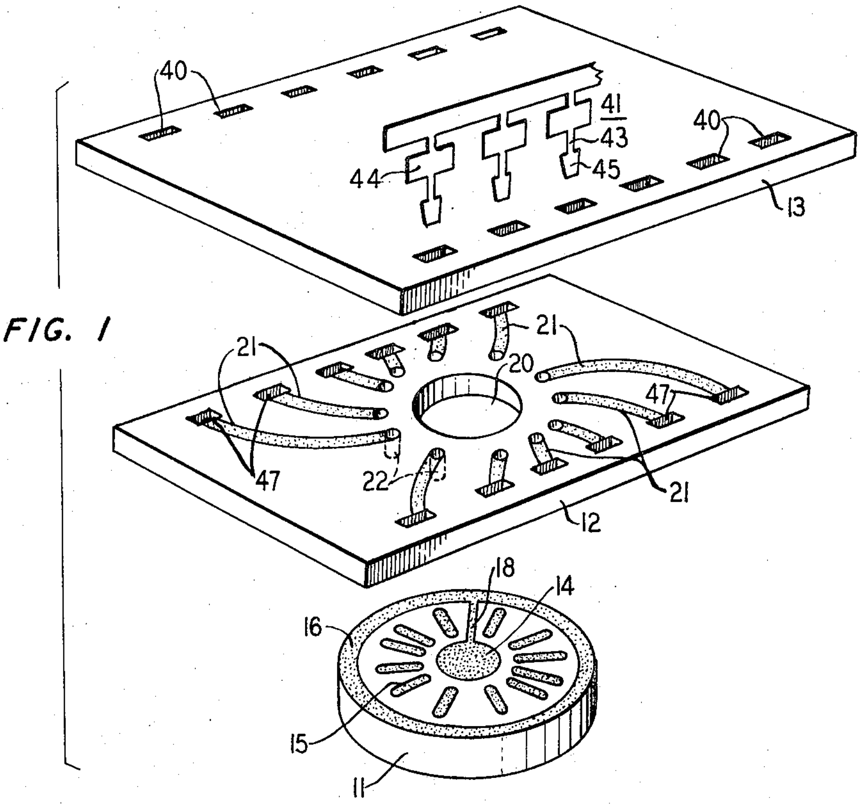
FIG. 1 is an exploded view of a package in accordance with the invention.

FIG. 1 shows an exploded view of a ceramic package assembly in accordance with this invention. The package comprises first, second and third ceramic layers 11, 12, and 13.

Layer 11 illustratively comprises a ceramic disk with a sunburst pattern of conductors on its top surface as viewed in FIG. 1. The pattern includes a centrally disposed metallic contact pad 14 to which an electronic device such as a semiconductor device is attached. The sunburst pattern comprises a plurality of conductors 15 radiating from the contact pad and terminating just short of a conductive ring 16 which encompasses the sunburst pattern. Each conductor of the sunburst pattern is said to have proximate and remote ends adjacent the contact pad and the ring, respectively. The contact pad is connected illustratively via a conductor 18 to annulus 16 to expedite electrical connection to pad 14.

Figure 2:
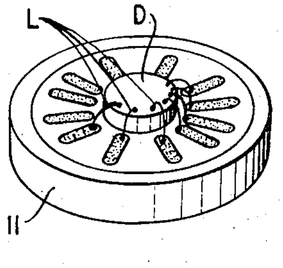
FIG. 2 is a plan view of one of the elements of FIG. 1 showing an electronic device secured thereto.

Layer 11 satisfies all the requirements for testing a semiconductor device having a plurality of active areas. Typically, such a device D is bonded to contact pad 14 and active areas therein are connected electrically to the proximate ends of associated ones of the conductors of the sunburst pattern via minute leads L as shown in FIG. 2. A device so interconnected may be tested in the same manner as are similar devices tested after being bonded in normal ceramic structures aftert the teeth of a familiar comb-like lead frame are separated. Only after satisfactory testing of devices so secured in accordance with this invention need the remainder of the encapsulation be secured to the first layer.

Figure 3:
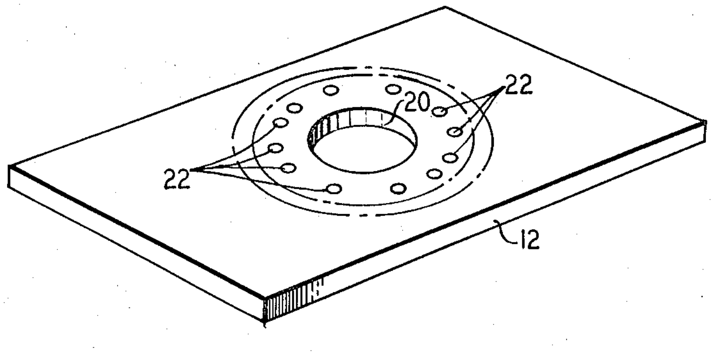
FIG. 3 is a bottom view of one of the elements of the package of FIG. 1.

The remainder of the encapsulation to which layer 11 is secured comprises a monolithic, fired ceramic structure including layers 12 and 13 which are shown spaced apart for ease of description in FIG. 1. Layer 12 comprises top and bottom surfaces as shown in FIGS. 1 and 3, respectively. The layer includes a central aperture 10 and on its top surface as viewed in FIG. 1 a second sunburst pattern of conductors 21. Again, each conductor 21 includes a proximate and a remote end closely spaced from the central aperture and adjacent the boundary of the layer, respectively, as is clear from FIG. 1.

The proximate end of each conductor of the second sunburst is associated with a metallized (or alternatively metal-filled) hole 22 which penetrates layer 12 as can be seen in FIG. 3. Aperture 20 also penetrates layer 12 and has dimensions to expose the proximate ends of sunburst pattern of conductors 15 of layer 11 and to cover the remote ends thereof when the layers 11 and 12 are abutted. The layer is designed to form a pocket for a pre-tested semiconductor device and avoid damaging leads 21 when the final package is completed.

Layer 12 is formed from the green ceramic as a monolithic structure with layer 13 of FIG. 1 for covering sunburst pattern 21. The resulting lamellate structure is fired to form a rigid subassembly for mating with layer 11 via ring 16 by a solder or a braze seal to ensure a hermetic seal for the encapsulated device. A solder seal is prepared by providing solder preforms on the bond surfaces of layers 11 and 12 as shown in FIGS. 1 and 3, or by precoating the surfaces with solder prior to heating under pressure.

The bottom of layer 12, as shown in FIG. 3, includes an imaginery annulus, shown in phantom, to identify the bond area for ring 16 of FIG. 1. In this embodiment, care is exercised to align metallized holes 22 with the remote ends of sunburst pattern 15. To simplify alignment, the conductors of the sunburst are typically wider than the aperture. Alternately, layer 11 may be formed in a noncircular shape and a matching aperture may be formed in an additional ceramic layer adjacent the bottom of layer 12. The aperture of this additional layer mates with layer 11 aligning the sunburst 15 and holes 22 automatically.

Figure 4:
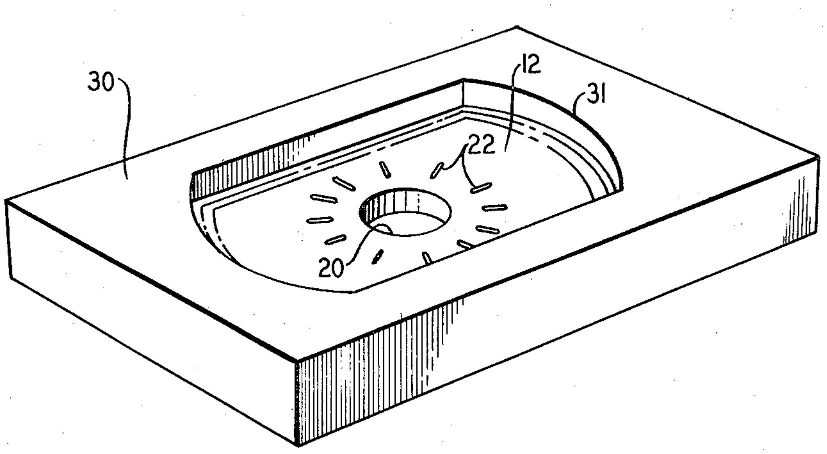
FIGS. 4 and 5 are bottom and top views of mating elements of an alternative element arrangement for a package of the type shown in FIG. 1.

FIG. 4 shows an enlarged bottom view of an alternative layer 12 with such an additional ceramic layer 30 fired therewith to form a monolithic three layer structure in accordance with this embodiment of this invention for mating with a test layer such as 11 of FIG. 1. Layer 30 has a rounded rectangular central aperture 31 through which the bottom surface of layer 12 is observed. The features of layer 12 — metallized holes 22 and central aperture 20 — are shown in the figure.

Figure 5:
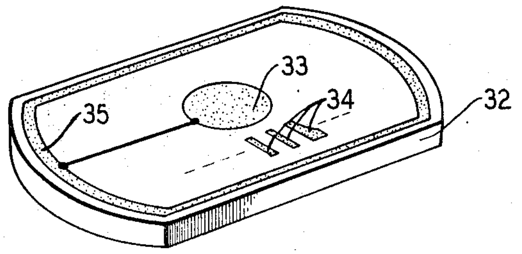

FIG. 5 shows a test layer 32 which corresponds to layer 11 of FIG. 1 having a geometry to mate with aperture 31 of FIG. 4. Layer 32 has a central contact pad 33, a sunburst pattern 34, and a metallic ring 35 to correspond to the features 14, 15, and 16 of layer 11 of FIG. 1. In this instance, only the geometry of the layer (and ring 35) is changed. FIG. 4 shows in phantom the area of layer 12 to which ring 35 is soldered after testing of a miniature electronic device.

External connection to a device pretested and encapsulated in accordance with this invention may be made in a variety of ways. In one arrangement, layer 13 is shown in FIG. 1 to include two sets of holes 40 along the long sides thereof. Such apertures illustratively form support geometries to which lead frames indicated at 41 of FIG. 1 are attached. The lead frame comprises a comb-like structure including a back member 42. Each tooth 43 illustratively includes a shoulder portion 44 which bears against the top surface of layer 13 allowing the lower portion of the tooth to fit through an associated hole 40. When the teeth are inserted in holes 40 up to shoulder portions 44, the end 45 of each tooth extends through holes 47 in layer 12. Holes 47 are metallized to ensure electrical contact with the remote ends of the associated conductors 21. Ends 45 are mechanically twisted at this time to lock the teeth in place and then soldered.

It should be clear that layer 11 of FIG. 1, or layer 32 of FIG. 5, is a single fired ceramic layer upon the surface of which all the conducting patterns may be provided in a single silk screening operation. Moreover, no lead frames are attached to the layer. The resulting structure presents a planar face for the bonding of electronic devices thereto as described — a considerable convenience. Testing of a device so bonded is carried out in a familiar manner presently realizable in ceramic packaged devices only after the teeth of a lead frame are isolated electrically. The failure of a device so bonded necessitates, at worst, the loss of the device along with the relatively inexpensive test portion — layer 11 — and not the relatively expensive lamellate arrangement and external leads of a prior art package. Alternatively, unsatisfactory devices may be salvaged by reflowing the bond to separate layers 11 and 12 and by removing the device. This procedure results in the loss of only layer 11.

The failure rate of devices tested in accordance with prior art procedures is known to average about two out of three. A "salvageable" package in accordance with this invention yields losses of as little as 1 percent.

An encapsulation of the type shown in FIG. 1 is fabricated as follows: Each of layers 12 and 13 are 0.50 inch square × 0.020 inch thick of a familiar 94 percent (by weight) $Al_2O_3$ green ceramic. Apertures 20, 22 and 40 (as well as 47) are 0.0300 inch, 0.30 inch in diameter, and 0.025 × 0.050 inch, respectively. Apertures 22 are coated by molybdenum and sunburst 21 is formed by silk screening procedures to produce molybdenum metallizing conductors 0.001 inch thick. Layer 11 is 0.500 inch in diameter, features 14, 15, and 16 being formed by silk screening procedures to a thickness of 0.001 inch. Contact pad 14 is 0.220 inch × 0.220 inch and ring 16 has an inside diameter of 0.480 inch.

Layers 12 and 13 are fired at 1,600° C to form a lamellate structure to which layer 11 is later affixed after a device is connected to layer 11 and pretested. Layer 11 is fired separately at the same temperature prior to the silk screening of the contact pattern thereon.

A hermetically sealed package results from the attachment of layers 11 and 13 in an inert atmosphere much the way caps are sealed to ceramic packages to complete familiar prior art structures. It follows that the joining of subassemblies in accordance with this invention may be understood more easily if layer 11 as shown in FIG. 1 is considered to be a "cap," and device D of FIG. 2 is considered to be bonded to the cap. In this context, it may be appreciated that the "cap" is relatively expendable. It may be appreciated also that it is generally thought necessary to sandwich a conductor sunburst pattern between green ceramic layers and to fire the resulting structure in order to achieve a hermetic seal about a number of conductors. In accordance with this invention, the conductors are still exposed to the outside world in this manner, but a closed-loop solder connection permits a hermetic seal to be formed between two mating sunbursts which do not pass through that closed loop. In the context, a device manufacturer may purchase "packages" and "caps" for assembly after pretesting.

No attempt has been made to exhaust all possible embodiments of this invention. What has been disclosed is to be understood to be merely illustrative of the principles of this invention. Therefore, various other embodiments can be devised by those skilled in the art in accordance with those principles within the spirit and scope of this invention.

What is claimed is:

1. A subassembly for electrical and mechanical interconnection to a microelectronic package, which package includes a fired ceramic monolithic structure having second and third ceramic layer, said second layer having a second metallic sunburst having proximate ends and remote ends and said remote ends including metalized apertures therethrough, said third layer overlying said second layer in a manner to expose the remote ends of the conductors of said second sunburst for external connection comprising a first fired ceramic layer having first and second surfaces, a first electrically conducting pad centrally located on said first surface, a first sunburst pattern of electrical conductors on said first surface having proximate ends close to but spaced apart from said first pad and having remote ends, and an electrically conducting first loop on said first surface encompassing said sunburst pattern spaced apart from said remote ends, said layer being free of provision for electrical connections therethrough.

2. A subassembly in accordance with claim 1 including an electrical connection between said first pad and said closed loop.

3. In combination with a subassembly in accordance with claim 1, a semiconductor device having a plurality of active regions, and means for electrically connecting said active regions to said first pad and to proximate ends of associated conductors of said first sunburst pattern.

4. A subassembly for a microelectronic package comprising a first fired ceramic layer having first and second surfaces, a first electrically conducting pad centrally located on said first surface, a first sunburst pattern of electrical conductors on said first surface having proximate ends close to but spaced apart from said first pad and having remote ends, and an electrically conducting closed loop on said first surface encompassing said sunburst pattern spaced apart from said remote ends said layer being free of provision for electrical connections therethrough, a fired ceramic monolithic structure comprising second and third ceramic layers, said second layer having a top and bottom surface, said second layer having a centrally disposed aperture therethrough, said aperture being sufficiently large to expose said proximate ends of said conductors of said first sunburst pattern when abutted to said first layer, said second layer having a second metallic sunburst pattern on said top surface having proximate ends near said aperture and remote ends at the extremities of said second layer also including metallized aperture therethrough at the proximate end of each of the conductors of said second sunburst pattern, said metallized apertures being disposed to correspond to the remote ends of the conductors of said first sunburst pattern, said third layer overlying the top surface of said second in a manner to expose the remote ends of the conductors of said second sunburst for external connection and for forming a package for receiving a semiconductor device, said bottom surface of said second layer being adapted for forming an hermetic seal with said conducting closed loop of said first surface of said first layer.

5. A combination in accordance with claim 4 wherein said first ceramic layer has a first noncircular shape and said monolithic ceramic structure includes a fourth ceramic layer adjacent said bottom surface of said second ceramic layer, said fourth ceramic layer having a central aperture therethrough, said aperture having said first non-circular geometry for receiving said first ceramic layer.

6. A ceramic package comprising said monolithic second and third fired ceramic layers in accordance with claim 4 secured to said first ceramic layer via said metallic closed loop in a manner whereby said package is hermetically sealed.

7. A ceramic package comprising said monolithic second, third, and fourth fired ceramic layers in accordance with claim 5 secured to said first ceramic layer in a manner whereby said package is hermetically sealed.

8. A ceramic package in accordance with claim 6 also including external leads connected to the remote ends of said conductors of said second sunburst pattern.

9. A ceramic package in accordance with claim 7 also including external leads connected to the remote ends of said conductors of said second sunburst pattern.

* * * * *